(12) United States Patent
Li

(10) Patent No.: US 10,490,457 B2
(45) Date of Patent: Nov. 26, 2019

(54) FIN FIELD-EFFECT TRANSISTOR AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Yong Li, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 134 days.

(21) Appl. No.: 15/238,573

(22) Filed: Aug. 16, 2016

(65) Prior Publication Data

US 2017/0062280 A1 Mar. 2, 2017

(30) Foreign Application Priority Data

Sep. 2, 2015 (CN) .......................... 2015 1 0555549

(51) Int. Cl.
*H01L 21/225* (2006.01)
*H01L 21/8238* (2006.01)
(Continued)

(52) U.S. Cl.
CPC .. *H01L 21/823821* (2013.01); *H01L 21/2255* (2013.01); *H01L 21/823892* (2013.01);
(Continued)

(58) Field of Classification Search
CPC ....... H01L 21/823821; H01L 29/66803; H01L 21/2255; H01L 27/0924; H01L 21/823892; H01L 21/823807; H01L 29/785; H01L 21/324; H01L 29/6653; H01L 21/823431; H01L 27/0886; H01L 29/41791; H01L 21/845; H01L 27/1211
See application file for complete search history.

(56) References Cited

U.S. PATENT DOCUMENTS

2011/0031552 A1* 2/2011 Iwamatsu ............. H01L 21/845
257/347
2011/0084336 A1* 4/2011 Luning ............. H01L 29/66795
257/347

(Continued)

*Primary Examiner* — Roy K Potter
(74) *Attorney, Agent, or Firm* — Anova Law Group, PLLC

(57) ABSTRACT

The present disclosure provides FinFET structures and fabrication methods thereof. An exemplary fabrication method includes providing a substrate having a first region and a second region; forming a first well region in first region and a second well region in the second region; forming at least one first fin in the first region and at least one second fin in the second region; forming a first doped layer covering the first fin; forming a second doped layer covering the second fin; forming first doped sidewall spacers on side surfaces of the first fin and second doped sidewall spacers on side surfaces of the second fin by a mask-less etching process; and performing a thermal annealing process to the first doped sidewall spacers and the second doped sidewall spacers to form a third well region in the first fin and a fourth well region in the second fin, respectively.

20 Claims, 6 Drawing Sheets

(51) Int. Cl.
*H01L 29/66* (2006.01)
*H01L 27/092* (2006.01)

(52) U.S. Cl.
CPC .... *H01L 27/0924* (2013.01); *H01L 29/66803* (2013.01); *H01L 21/823807* (2013.01)

(56) References Cited

U.S. PATENT DOCUMENTS

2014/0175554 A1\* 6/2014 Loubet .............. H01L 21/82343
257/368
2017/0062427 A1\* 3/2017 Basker ............ H01L 21/823821

\* cited by examiner

FIN FIELD-EFFECT TRANSISTOR AND FABRICATION METHOD THEREOF

CROSS-REFERENCES TO RELATED APPLICATIONS

This application claims the priority of Chinese patent application No. 201510555549.1, filed on Sep. 2, 2015, the entirety of which is incorporated herein by reference.

FIELD OF THE INVENTION

The present invention generally relates to the field of semiconductor manufacturing technology and, more particularly, relates to fin field-effect transistors and fabrication processes thereof.

BACKGROUND

With the continuous development of semiconductor technologies, the trend for the technical node of the semiconductor technologies to follow the Moore's law has become smaller and smaller. To adapt the decrease of the technical node, the channel length of the MOSFET has to be continuously decreased. Decreasing the channel length has the benefits such as increasing the integration level of the chip, and increasing the switch speed of the MOSFET, etc.

However, with the continuous shrinking of the channel length, the distance between the source region and the drain region of the semiconductor device has been reduced correspondingly. Thus, the control ability of the gate of the semiconductor device on the channel region is also reduced; and the difficulty for the gate to pinch off the channel is increased. Therefore, it is easier to have the subthreshold leakage phenomenon, i.e., short-channel effects (SCEs), etc.

Thus, to better meet the scaling down requirements of the semiconductor devices, the semiconductor technology has gradually transformed from the conventional planar devices to three-dimensional transistors, for example, fin field effect transistors (FinFETs), etc. In a FinFET, the gate may be able to control the ultra-thin component (fin) from two sides. Thus, comparing with the conventional planar MOSFET, the control ability of the gate to the channel region is significantly enhanced; and it may be able to effectively inhibit the short channel effects. Further, comparing with other types of devices, FinFETs have a better compatibility with the existing integrated circuit manufacturing technology.

However, the performance of the FinFETs formed by the existing fabrication methods may need further improvements. The disclosed device structures and methods are directed to solve one or more problems set forth above and other problems in the art.

BRIEF SUMMARY OF THE DISCLOSURE

One aspect of the present disclosure includes a method for fabricating a FinFET structure. The method includes providing a substrate having a first region and a second region; forming a first well region in the substrate in the first region and a second well region in the substrate in the second region; forming at least one first fin on the substrate in the first region and at least one second fin on the substrate in the second region; forming a first doped layer covering the first fin in the first region over the substrate; forming a second doped layer covering the second fin in the second region over the substrate; forming first doped sidewall spacers on side surfaces of the first fin and second doped sidewall spacers on side surfaces of the second fin by at least one mask-less etching process; and performing a thermal annealing process to the first doped sidewall spacers and the second doped sidewall spacers to form a third well region in the first fin and a fourth well region in the second fin, respectively.

Another aspect of the present disclosure includes a FinFET structure. The FinFET structure includes a substrate having a first region and a second region; a first well region formed in the substrate in the first region and a second well region formed in the substrate in the second region; at least one first fin formed on the substrate in the first region and at least one second fin formed on the substrate in the second region; first doped sidewall spacers with top surfaces lower than a top surface of the first fin formed on bottom portions of side surfaces of the first fin; second doped sidewall spacers with top surfaces lower than a top surface of the second fin formed on bottom portions of side surfaces of the second fin; a dielectric layer covering the side surfaces of the first doped sidewall spacers and the second doped sidewall spacers formed over the substrate; and a third well region in the first fin and a fourth well region in the second fin formed by ion diffusions from the first doped sidewall spacers and the second doped sidewall spacers, respectively.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

In a FinFET, the distance between the bottom of the fin and the gate structure may be relatively large. Thus, the control ability of the gate structure to the bottom of the fin may be relatively weak. Further, the doping concentration of the fin may be relatively low, the spatial charge region in the channel region may be broadened; and the spatial charge region of the source region and the spatial charge region of the drain region may be connected. Thus, the bottom of the FinFET may have a punch through phenomenon; and the performance of the FinFET may be affected.

Further, to improve the performance of the FinFET, the semiconductor substrate may be doped with certain dopants. The dopants may be easy to diffuse into the fin; and the distribution of the dopants diffused into the fin may be non-uniform. The non-uniform distribution of the dopants may change the threshold voltage. Such a threshold voltage change is another reason for the FinFET to have unacceptable performance. Especially for SRAM devices, if the dopants in the substrate diffuse into the fin, the mismatch among devices may become worse. For example, the mismatch between the pull-up (PU) transistors and PU transistors, and the mismatch between the pull-down (PD) transistors and the PD transistors may be unacceptable; and the uniformity of the SRAM devices may become worse. Such issues and other related issues may be overcome by forming super step retrograde wells in the fin.

Figure 14:
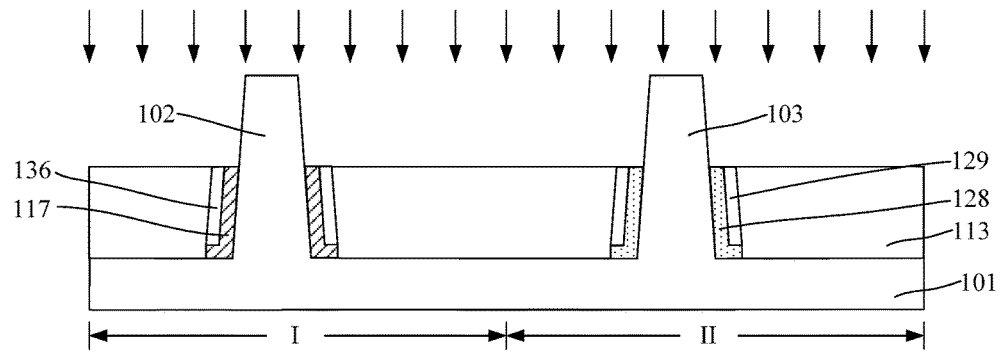
Figure 15:
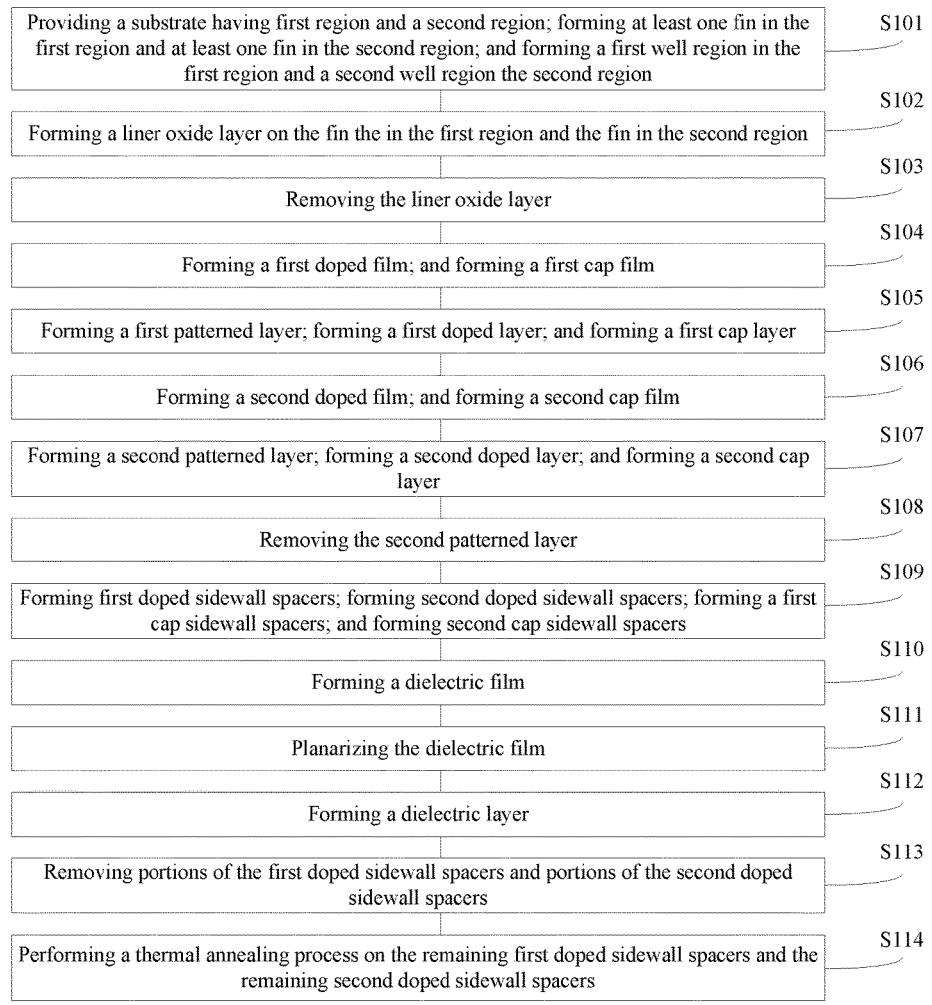
FIG. 15 illustrates an exemplary fabrication process of a FinFET structure consistent with the disclosed embodiments.

FIG. 15 illustrates an exemplary fabrication process of a FinFET structure consistent with the disclosed embodiments. FIGS. 1-14 illustrate semiconductor structures corresponding to certain stages of the exemplary fabrication process.

Figure 1:
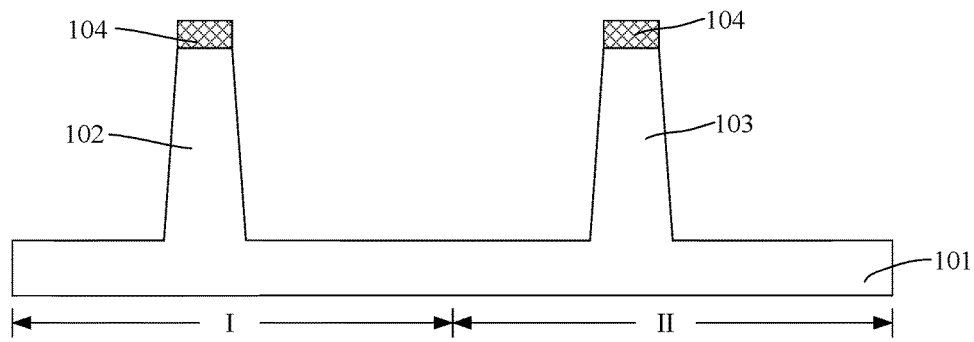
FIGS. 1-14 illustrate semiconductor structures corresponding certain stages of an exemplary fabrication process of a FinFET structure consistent with the disclosed embodiments.

As shown in FIG. 15, at the beginning of fabrication process, a substrate with certain structures is provided (S101). FIG. 1 illustrates a corresponding semiconductor structure.

As shown in FIG. 1, a substrate 101 is provided. The substrate 101 may include a first region I and a second region II. A plurality of discrete first fins 102 may be formed on the surface of the substrate 101 in the first region I; and a plurality of discrete second fins 103 may be formed on the surface of the substrate 101 in the second region II.

For illustrative purposes, one first fin 102 and one second fin 103 will be described. Still for illustrative purposes, the FinFET structure is a CMOS device. The first region I may be a NMOS region; and NMOS devices may be formed in the first region I. The second region II may be a PMOS region; and PMOS devices may be formed in the second region II. The first region I and the second region II may be adjacent. In certain other embodiments, the first region I may be a PMOS region; and the second region II may be a NMOS region.

The substrate 101 may be made of any appropriate semiconductor material, such as silicon, polysilicon, silicon on insulator (SOI), germanium on insulator (GOI), silicon germanium, carborundum, indium antimonite, lead telluride, indium arsenide, indium phosphide, gallium arsenide, gallium antimonite, alloy semiconductor, or a combination thereof. In one embodiment, the substrate 101 is made of silicon. The substrate 101 provides a base for subsequent structures and processes.

Further, a first well region (not shown) may be formed in the first region I of the substrate 101. The first well region may be doped with P-type ions. The P-type ions may be B ions, Ga ion, or In ions, etc.

Further, a second well region (not shown) may be formed in the second region II of the substrate 101. The second well region may be doped with N-type ions. The N-type ions may be P ions, As ions, or Sb ions, etc.

The first fin 102 may be made of Si, Ge, SiGe, SiC, GaAs, or InGa, etc. The second fin 103 may be made of Si, Ge, SiGe, SiC, GaAs, or InGa, etc. In one embodiment, the first fin 102 is made of Si; and the second fin 103 is made of Si.

In one embodiment, the process for forming the substrate 101, the first fin 102 and the second fin 103 may include providing an initial substrate; forming a patterned hard mask layer 104 on the surface of the initial substrate; and etching the initial substrate using the patterned hard mask layer 104 as an etching mask. The etched initial substrate may be configured as the substrate 101; the protruding portion in the first region I of the substrate 101 may be configured as the first fin 102; and the protruding portion in the second region II of the substrate 101 may be configured as the second fin 103.

In one embodiment, the patterned hard mask layer 104 may be formed by forming an initial hard mask layer on the surface of the initial substrate; forming a patterned photoresist layer on the surface of the initial hard mask layer; etching the initial hard mask layer using the patterned photoresist as an etching mask to form the patterned hard mask layer 104 on the surface of the initial substrate; and removing the patterned photoresist layer.

In certain other embodiments, the patterned hard mask layer 104 may be formed by a self-aligned double patterning (SADP) process, a self-aligned triple patterning process, or a self-aligned double-double patterning process, etc. The SADP process may be a litho-etch-litho-etch (LELE) process, or a litho-litho-etch (LLE) process.

In one embodiment, as shown in FIG. 1, after forming the first fin 102 and the second fin 103, the hard mask layer 104 on the surface of the first fin 102 and the second fin 103 may be kept. The hard mask layer 104 may be made of silicon nitride. When a planarization process is subsequently performed, the top surface of the hard mask layer 104 may be used as a stop position of the planarization process.

In one embodiment, as shown in FIG. 1, the top size of the first fin 102 may be smaller than the bottom size of the fin 102. The top size of the second fin 103 may be smaller than the bottom size of the second fin 103.

In certain other embodiments, the side surfaces of the first fin 102 may be perpendicular to the surface of the substrate 101. That is, the top size of the first fin 102 may be identical to the bottom size of the first fin 102. The side surfaces of the second fin 103 may be perpendicular to the surface of the substrate 101. That is, the top size of the second fin 103 may be identical to the bottom size of the second fin 103.

Figure 2:
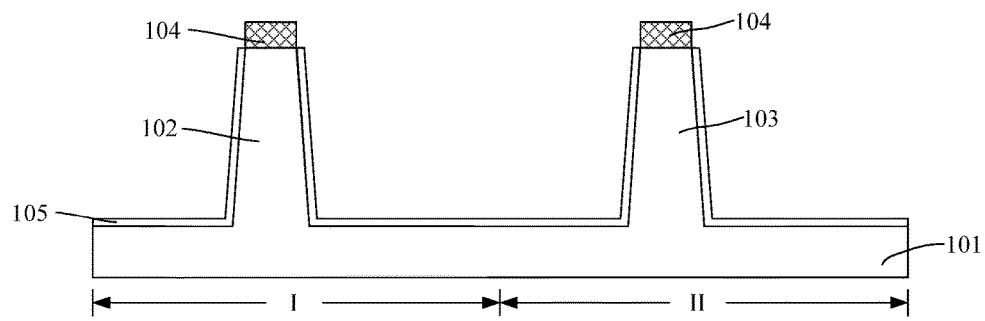

Returning to FIG. 15, after forming the first fin 102 and the second fin 103, a liner oxide layer may be formed (S102). FIG. 2 illustrates a corresponding semiconductor structure.

As shown in FIG. 2, a liner oxide layer 105 is formed on the surfaces of the first fin 102, the second fin 103 and the substrate 101. The liner oxide layer 105 may be formed by oxidizing the surfaces of the first fin 102, the second fin 103 and the substrate 101.

Because the first fin 102 and the second fin 103 may be formed by etching the initial substrate, the first fin 102 and the second fin 103 may have some protruding edges and corners; and the surface of the first fin 102 and the second fin 103 may have some defects. Such edges, corners and defects on the first fin 102 and the second fin 103 may affect the performance of the subsequently formed FinFET structure.

Thus, in one embodiment, the first fin 102 and the second fin 103 may be oxidized to form the liner oxide layer 105. During the oxidation process, because the surface-to-volume ratio of the protruding corner and edge portions of the first fin 102 may be larger than that of other portions, the protruding corner and edge portions may be easily oxidized. When the liner oxide layer 105 is subsequently removed, the protruding edges and corners may also be removed. Thus, the surface of the first fin 102 may be smoothed; and the quality of the crystal lattice of the first fin 102 may be improved. Accordingly, the point discharge on the edge and corner portions of the first fin 102 may be avoided; and the performance of the FinFET structure may be improved.

Similarly, when the liner oxide layer 105 is subsequently removed, the protruding edges and corners on the second fin 103 may also be removed. Thus, the surface of the second fin 103 may be smoothed; and the quality of the crystal lattice of the second fin 103 may be improved. Accordingly, the point discharge on the edge and corner portions of the second fin 103 may be avoided; and the performance of the FinFET structure may be improved.

The oxidation process may be an oxygen plasma oxidation process, or a sulfuric acid and hydrogen peroxide mixture oxidation process, etc. The oxidation process may also oxidize the surface of the substrate 101. Thus, the liner oxide layer 105 may also be formed on the surface of the substrate 101.

In one embodiment, an in-situ stream generation (ISSG) oxidation process is used to oxidize the first fin 102 and the second fin 103 to form the liner oxide layer 105. Because the first fin 102 and the second fin 103 may be made of Si, the corresponding liner oxide layer 105 may be made of silicon oxide.

Figure 3:
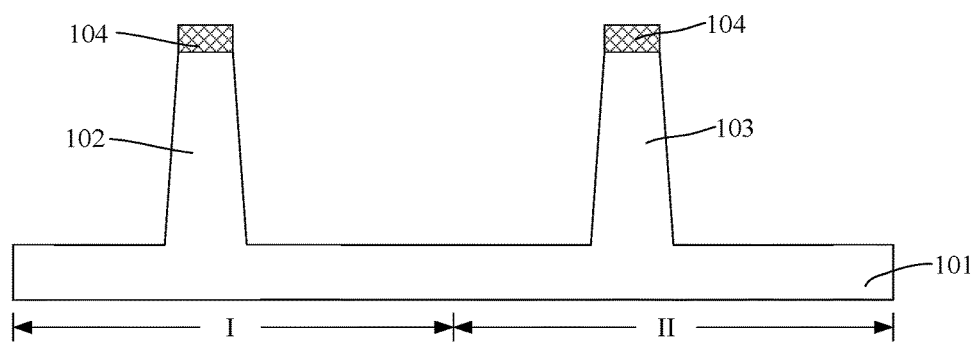

Returning to FIG. 15, after forming the liner oxide layer 105, the liner oxide layer 105 may be removed (S103). FIG. 3 illustrates a corresponding semiconductor structure.

As shown in FIG. 3, the liner oxide layer 105 is removed. After removing the liner oxide layer 105, the crystal lattice quality of the surfaces of the first fin 102 and the second fin 103 may be improved. The edges and corners of the first fin 102 and the second fin 103 may be smoother; and the tip discharge issue at the edges and corners of the first fin 102 and the second fin 103 may be avoided.

The liner oxide layer 105 may be removed by any appropriate process, such as a drying etching process, or a wet etching process, etc. In one embodiment, a wet etching process is used to remove the liner oxide layer 105. When the liner oxide layer 105 may be made of silicon oxide, the etching solution of the wet etching process may include a HF solution.

Figure 4:
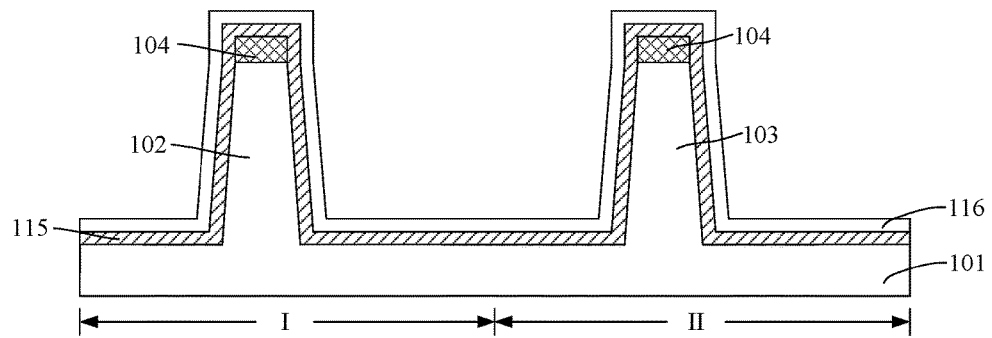

Returning to FIG. 15, after removing the liner oxide layer 105, a first doped-film and a first cap film may be formed (S104). FIG. 4 illustrates a corresponding semiconductor structure.

As shown in FIG. 4, a first doped film 115 is formed on the top and side surfaces of the first fin 102 and the second fin 103. Further, a first cap film 116 may be formed on the first doped film 115.

Specifically, in one embodiment, the hard mask layer 104 may be formed on the top of the first fin 102 and the top of the second fin 103. Thus, the first doped film 115 may also cover the top surface of the hard mask layer 104.

In certain other embodiments, before forming the first doped film 115, the top of the first fin 102 and the top of the second fin 103 may be exposed. Thus, besides covering the side surfaces of the first fin 102 and the second fin 103, the first doped film 115 may also cover the top surface of the first fin 102 and the top surface of the second fin 103.

The first doped film 115 may provide a process foundation for subsequent processes. For example, the first doped layer 115 may be an adhesion layer between the first fin 102 and the subsequently formed sidewall spacers.

The first doped film 115 may be doped with a first type of doping ions. The first type may be N-type, or P-type. In one embodiment, the first region I may be a NMOS region. Thus, the first type of ions doped in the first doped film 115 may be P-type ions, such as B ions, Ga ions, or In ions, etc. In one embodiment, the P-type ions are B ions. The concentrations of B ions in the first doped film 115 may be in a range of approximately 1E19 atom/cm$^3$-5E21 atom/cm$^3$.

The first doped film 115 may be made of an insulation material. Correspondingly, the subsequently formed first doped sidewall spacers may also be made of insulation material. Thus, the first doped sidewall spacers on the side surfaces of the first fin 102 may not affect the critical dimension (CD) of the first fin 102. Further, the first doped film 115 may be made of an easy-to-remove material such that the process for subsequently removing the first doped film 115 may not damage the first fin 102.

Thus, the first doped film 115 may be made of silicon oxide, silicon nitride, silicon oxynitride, silicon carbonitride, or silicon oxycarbonitride, etc. Various processes may be used to form the first doped film 115, such as a chemical vapor deposition (CVD) process, a physical vapor deposition (PVD) process, or an atomic layer deposition (ALD) process, etc.

In one embodiment, the first doped film 115 is made of silicon oxide. During the process for forming the first doped-film 115, besides introducing an oxygen source gas and a silicon source gas into the reaction chamber, a boron source gas may also be introduced into the reaction chamber as a doping gas. The boron source gas may be $BH_3$, etc.

The thickness of the first doped film 115 may be in a range of approximately 1 nm-5 nm. In one embodiment, the first doped film 115 is formed by an ALD process. Because the ALD process may have a relatively high step-coverage ability, the first doped film 115 formed by the ALD process may be able to well cover the corners between the substrate 101 and the first fin 102.

Further, as shown in FIG. 4, after forming the first doped film 115, the first cap film 116 may be formed on the first doped film 115. The compactness of the first cap film 116 may be greater than the compactness of the first doped film 115. Based on the first cap film 116, first cap sidewall spacers may be subsequently formed on subsequently formed first doped sidewall spacers. The first cap sidewall spacers may prevent the P-type ions in the first doped sidewall spacers from diffusing into a subsequently formed dielectric layer so as to cause the P-type ions in the first doped sidewall spacers to diffuse into the first fin 102 as much as possible.

The first cap film 116 may be made of any appropriate material. In one embodiment, the first cap film 116 is made of silicon nitride. The thickness of the first cap film 116 may be in a range of approximately 1 nm-2 nm.

Various processes may be used to form the first cap film 116, such as a CVD process, a PVD process, or an ALD process, etc. In one embodiment, the first cap film 116 is formed by an ALD process.

Figure 5:
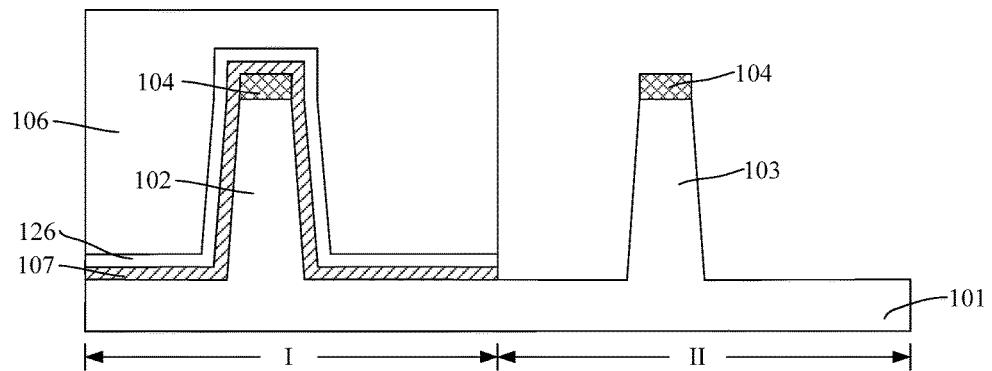

Returning to FIG. 14, after forming the first cap film 116, a first patterned layer, a first doped layer, and a first cap layer may be formed (S105). FIG. 5 illustrates a corresponding semiconductor structure.

As shown in FIG. 5, a first doped layer 107 is formed on the side surfaces of the first fin 102, and the top surface of the hard mask layer 104. Further, a first cap layer 126 is formed on the first doped layer 107; and a first patterned layer 106 is formed on the first cap layer 126.

A process for forming the first cap layer 126 and the first doped layer 107 may include forming the first patterned layer 106 on the first cap film 116 (referring to FIG. 4) in the first region I, followed by etching first cap film 116 and the first doped film 115 using the first patterned layer 106 as an etching mask to remove the first cap film 116 and the first doped film 115 in the second region II.

The first patterned layer 106 may be used as an etching mask for forming the first cap layer 126 and the first doped layer 107. The first patterned layer 106 may be made of any appropriate material. In one embodiment, the first patterned layer 106 is made of photoresist.

A process for forming the first patterned layer 106 may include forming a photoresist layer on the surface of the first cap film 116 (referring to FIG. 5); and exposing and developing the photoresist layer to remove the photoresist layer in the second region II. Thus, the first patterned layer 106 may be formed.

Referring to FIG. 5, after forming the first patterned layer 106, the portion of the first cap film 116 and the portion of the first doped film 115 in the second region II may be removed by the etching process using the first patterned layer 106 as an etching mask. Thus, the first cap layer 126 and the first doped layer 107 may be formed.

The first doped layer 107 may cover the side surfaces of the fin 102. The first doped layer 107 may also cover the surface of the substrate 101 in first region I. The first cap layer 126 may cover the surface of the first doped layer 107.

Various processes may be used to remove the portion of the first cap film 116 and the portion of the first doped film 115 in the second region II, such as a dry etching process, or a wet etching process, etc. In one embodiment, the portion of the first cap film 116 and the portion of the first doped film 115 in the second region II are removed by a dry etching process.

Referring to FIG. 5, because the hard mask layer 104 may be formed on the top surface of the first fin 102, the first doped layer 107 may cover the top surface of the hard mask layer 104. In certain other embodiments, before forming the first doped film 115, the top surface of the first fin 102 may be exposed, the first doped layer 107 may cover the top surface of the first fin 102.

The first doped layer 107 may be doped with a first type of doping ions. The first type of doping ions may be P-type ions or N-type ions. In one embodiment, the first region I is a NMOS region, the first type of doping ions may be P-type ions. The first doped layer 107 may subsequently supply P-type ions to the first fin 102 to form a third well region under the bottom of the first fin 102. The doping type of the third well region may be similar to the doping type of the first well region. Further, the doping concentration of the third well region may be greater than the doping concentration of the first well region such that a super step retrograde well (SSRW) may be subsequently formed in the NMOS device of the FinFET structure.

The first doped layer 107 may be made of a material identical to that of the first doped film 115. The first doped layer 107 may be made of silicon oxide, silicon nitride, silicon oxynitride, silicon oxycarbide, silicon carbonitride, or silicon oxycarbonitride, etc. The first doped layer 107 may be doped with P-type ions, such as B ions, Ga ions, or In ions, etc.

In one embodiment, the first doped layer 107 is made of silicon oxide; and the P-type doping ions are B ions. The concentration of the B ions in the first doped layer 107 may be in a range of approximately 1E19 atom/cm$^3$-5E21 atom/cm$^3$. The thickness of the first doped layer 107 may be in a range of approximately 1 nm-4 nm.

The cap layer 126 may be made of silicon nitride. The thickness of the cap layer 126 may be in a range of approximately 1 nm-2 nm.

After forming the first doped layer 107, the first patterned layer 106 may be removed (not shown). Various processes may be used to remove the first patterned layer 106. In one embodiment, the first patterned layer 106 is made of photoresist, a wet etching process or a plasma ashing process may be used to remove the first patterned layer 106.

Figure 6:
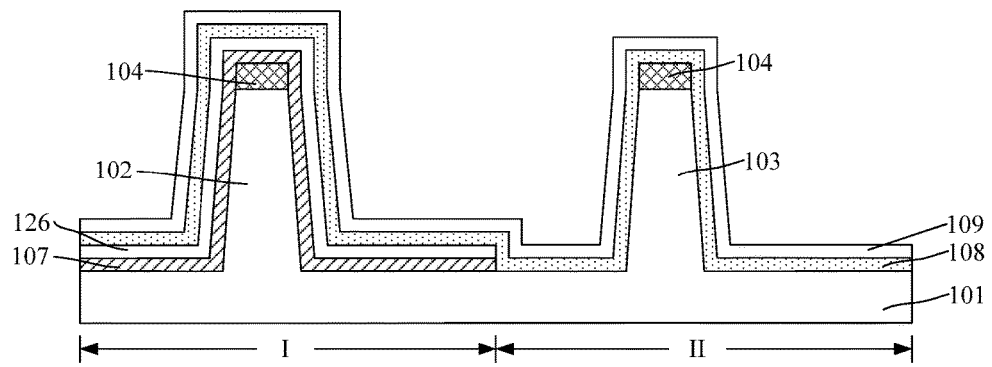

Returning to FIG. 15, after forming the first doped layer 107, a second doped film and a second cap film may be formed (S106). FIG. 6 illustrates a corresponding semiconductor structure.

As shown in FIG. 6, a second doped film 108 is formed on the top and side surfaces of the second fin 102, the surface of the substrate 101 in the second region II, and the first cap layer 126. Further, a second cap film 109 may be formed on the second doped film 108.

Specifically, in one embodiment, the hard mask layer 104 may be formed on the top of the second fin 103. Thus, the second doped film 108 may cover the top surface of the hard mask layer 104.

In certain other embodiments, before forming the second doped film 108, the top of the second fin 103 may be exposed. Thus, besides covering the side surfaces of the second fin 103, the second doped film 108 may also cover the top surface of the second fin 103.

The second doped film 108 may provide a process foundation for subsequent processes. For example, the second doped film 108 may be an adhesion layer between the second fin 103 and the subsequently formed sidewall spacers. After subsequently removing the second doped layer 108 in the first region I, a second doped layer may be formed on the side surfaces of the second fin 103, and the surface of the substrate 101 in the second region II.

The second doped film 108 may be doped with a second type of doping ions. In one embodiment, the second type of ions may be N-type ions, such as P ions, As ions, or Sb ions, etc. In one embodiment, the N-type ions are P ions. The concentrations of P ions in the second doped film 108 may be in a range of approximately 1E19 atom/cm$^3$-6E21 atom/cm$^3$.

The second doped film 108 may be made of an insulation material. Correspondingly, the subsequently formed second doped sidewall spacers may also be made of an insulation material. Thus, the second doped sidewall spacers on the side surfaces of the second fin 103 may not affect the CD of the second fin 103. Further, the second doped film 108 may be made of an easy-to-remove material such that the process for subsequently removing the second doped film 108 may not damage the second fin 108.

Thus, the second doped film 108 may be made of silicon oxide, silicon nitride, silicon oxynitride, silicon carbonitride, or silicon oxycarbonitride, etc. Various processes may be used to form the second doped film 108, such as a CVD process, a PVD process, or an ALD process, etc.

In one embodiment, the second doped film 108 is made of silicon oxide. During the process for forming the second doped film 108, besides introducing an oxygen source gas and a silicon source gas into the reaction chamber, a phosphorous source gas may also be introduced into the reaction chamber as a doping gas. The phosphorous source gas may be PH$_3$, etc.

The thickness of the second doped film 108 may be in a range of approximately 1 nm-4 nm. In one embodiment, the second doped film 108 is formed by an ALD process. Because the ALD process may have a relatively high step-coverage ability, the second doped film 108 formed by the ALD process may be able to well cover the corners between the substrate 101 and the second fin 103.

Further, as shown in FIG. 6, after forming the second doped film 108, the second cap film 109 may be formed on the second doped film 108. The compactness of the second cap film 109 may be greater than the compactness of the second doped film 108. Based on the second cap film 109, second cap sidewall spacers may be subsequently formed on subsequently formed first doped sidewall spacers. The second cap sidewall spacers may prevent the N-type ions in the second doped sidewall spacers from diffusing into a subsequently formed dielectric layer so as to cause the N-type ions in the second doped sidewall spacers to diffuse into the second fin 103 as much as possible.

The second cap film 109 may be made of any appropriate material. In one embodiment, the second cap film 109 is made of silicon nitride. The thickness of the second cap film 109 may be in a range of approximately 1 nm-2 nm.

Various processes may be used form the second cap film 109, such as a CVD process, a PVD process, or an ALD process, etc. In one embodiment, the second cap film 109 is formed by an ALD process.

Figure 7:
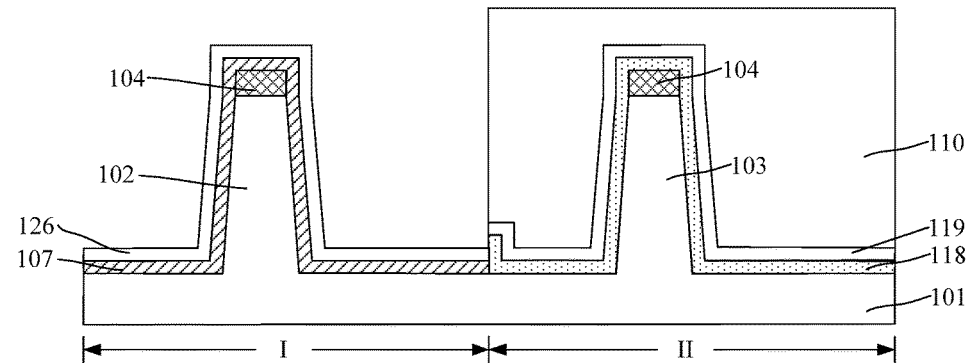

Returning to FIG. 15, after forming the second cap film 109, a second patterned layer, a second doped layer, and a second cap layer may be formed (S107). FIG. 7 illustrates a corresponding semiconductor structure.

As shown in FIG. 7, a second doped layer 118 is formed on the side surfaces of the second fin 103, the surface of the substrate 101 in the second region II, and the top surface of the hard mask layer 104. Further, a second cap layer 119 is formed on the second doped layer 118; and a second patterned layer 110 is formed on the second cap layer 119.

A process for forming the second cap layer 119 and the second doped layer 118 may include forming the second patterned layer 110 on the second cap film 109 (referring to FIG. 7) in the second region II, followed by etching the second cap film 109 and the second doped film 108 using the second patterned layer 110 as an etching mask to remove the second cap film 109 and the second doped film 108 in the first region I.

The second patterned layer 110 may be used as an etching mask for forming the second cap layer 119 and the second doped layer 118. The second patterned layer 110 may be made of photoresist, etc.

Various processes may be used to remove the portion of the second cap film 109 and the portion of the second doped film 108 in the first region I, such as a dry etching process, or a wet etching process, etc. In one embodiment, the portion of the second cap film 109 and the portion of the second doped film 108 in the first region I are removed by a dry etching process.

Figure 8:
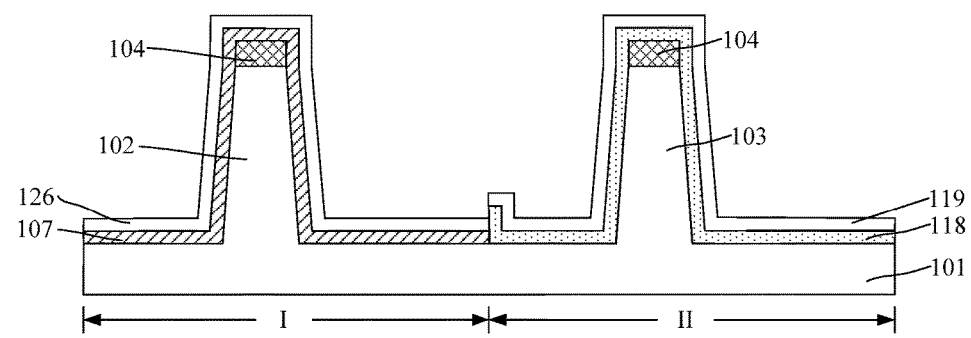

Referring to FIG. 8, because the hard mask layer 104 may be formed on the top surface of the second fin 103, the second doped layer 118 may cover the top surface of the hard mask layer 104. In certain other embodiments, before forming the second doped film 108, the top surface of the second fin 103 may be exposed, the second doped layer 118 may also cover the top surface of the second fin 103.

Further, referring to FIG. 8, at the interface region between the first region I and the second region II, the first doped layer 107 and the second doped layer 118 may have an interface.

The second doped layer 118 may be doped with a second type of doping ions. The second type of doping ions may be P-type ions, or N-type ions. In one embodiment, the second region II is a PMOS region, the second type of doping ions may be N-type ions. The second doped layer 118 may subsequently supply N-type ions to the second fin 103 to form a fourth well region under the bottom of the second fin 103. The doping type of the fourth well region may be similar to the doping type of the second well region in the semiconductor substrate 101. Further, the doping concentration of the fourth well region may be greater than the doping concentration of the second well region such that a super step retrograde well (SSRW) may be subsequently formed in the PMOS device of the FinFET structure.

The second doped layer 118 may be made of silicon oxide, silicon nitride, silicon oxynitride, silicon oxycarbide, silicon carbonitride, or silicon oxycarbonitride, etc. The second doped layer 118 may be doped with N-type ions, such as P ions, As ion, or Sb ions, etc.

In one embodiment, the second doped layer 118 is made of silicon oxide; and the N-type doping ions are P ions. The concentration of the P ions in the second doped layer 118 may be in a range of approximately $1E19$ atom/cm$^3$-$6E21$ atom/cm$^3$. The thickness of the second doped layer 118 may be in a range of approximately 1 nm-4 nm.

The second cap layer 119 may be made of silicon nitride. The thickness of the second cap layer 119 may be in a range of approximately 1 nm-2 nm.

Returning to FIG. 15, after forming the second doped layer 118, the second patterned layer 110 may be removed (S108). FIG. 8 illustrates a corresponding semiconductor structure.

As shown in FIG. 8, the second patterned layer 110 is removed. The second patterned layer 110 may be removed by any appropriate process. In one embodiment, the second patterned layer 110 is made of photoresist, a wet etching process or a plasma ashing process may be used to remove the second patterned layer 110.

As described above, the first doped layer 107 may be formed firstly, then the second doped layer 118 is formed. In certain other embodiments, the second doped layer 118 may be formed firstly, then the first doped layer 107 may be formed.

Figure 9:
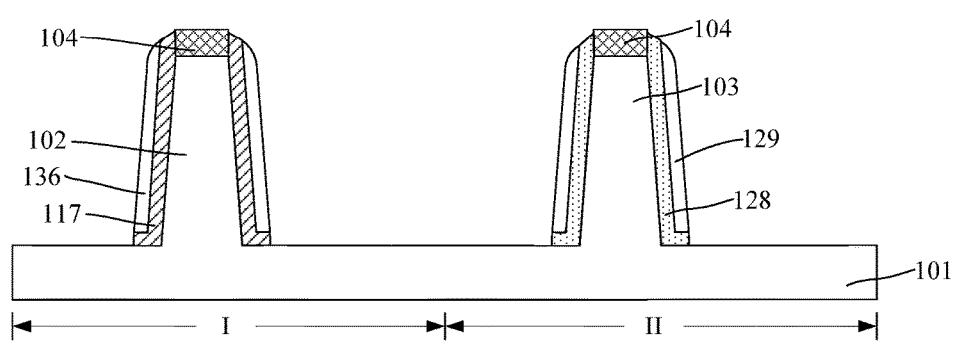

Returning to FIG. 15, after removing the second patterned layer 110, first doped sidewall spacers, second doped sidewall spacers, first cap sidewall spacers and second cap sidewall spacers may be formed (S109). FIG. 9 illustrates a corresponding semiconductor structure.

As shown in FIG. 9, first doped sidewall spacers 117 and first cap sidewall spacers 136 are formed on the side surfaces of the first fin 102. Second doped sidewall spacers 128 and second cap sidewall spacers 129 are formed on the side surfaces of the second fin 103.

The first cap sidewall spacers 136 may be formed by removing portions of the first cap layer 126 (referring to FIG. 8) on the top surface of the substrate 101 in the first region I and the top surface of the first fin 102 by a mask-less etching process. The first doped sidewall spacers 117 may be formed by removing portions of the first doped layer 107 (referring to FIG. 8) on the top surface of the substrate 101 in the first region I and the top surface of the first fin 102 by a mask-less etching process. The second cap sidewall spacers 129 may be formed by removing portions of the second cap layer 119 (referring to FIG. 8) on the top surface of the substrate 101 in the second region II and the top surface of the second fin 103 by a mask-less etching process. The second doped sidewall spacers 128 may be formed by removing portions of the second doped layer 118 (referring to FIG. 8) on the top surface of the substrate 101 in the second region II and the top surface of the second fin 103 by a mask-less etching process.

In one embodiment, the mask-less etching processes may be a same mask-less etching process. In certain other embodiments, the mask-less etching processes may be two or more mask-less etching processes.

The first doped sidewall spacers 117 may be made of silicon oxide, silicon nitride, silicon oxynitride, silicon carbide, silicon oxycarbide, or silicon oxycarbonitride, etc. The second doped sidewall spacers 128 may be made of silicon oxide, silicon nitride, silicon oxynitride, silicon carbide, silicon oxycarbide, or silicon oxycarbonitride, etc. The first doped sidewall spacers 117 may be doped with P-type ions, such as B ions, Ga ions, or In ions, etc. The second doped sidewall spacers 128 may be doped with N-type ions, such as P ions, As ions, or Sb ions, etc.

In one embodiment, the first doped sidewall spacers 117 is made of silicon oxide; and the P-type ions are B ions. The second doped sidewall spacers 128 is made of silicon oxide;

and the N-type ions are P ions. The first cap sidewall spacers 136 may be made of silicon nitride. The second cap sidewall spacers 129 may be made of silicon nitride.

In one embodiment, the mask-less etching processes are a same mask-less etching process. The mask-less etching process may be a plasma etching process. During the mask-less etching process, the etched amount of the first cap layer 126 on the side surfaces of the first fin 102 may be kept as less as possible; and the etched amount of the second cap layer 119 on the side surfaces of the second fin 103 may be kept as less as possible.

In one embodiment, as shown in FIG. 9, after the mask-less etching process, the first doped sidewall spacers 117 and the second doped sidewall spacers 128 may not have a contact interface. Thus, during the subsequent thermal annealing process, the first doped sidewall spacers 117 and the second doped sidewall spacers 128 may not have an unnecessary interface reaction. Accordingly, the adverse effect of the interface reaction to the FinFET structure may be avoided.

If the first doped layer 107 and the second doped layer 118 are not etched by the mask-less etching process, the first doped layer 107 and the second doped layer 118 may have an interface. That is, the first doped layer 107 may contact with the second doped layer 118. Further, the first doped layer 107 may be doped with P-type ions; and the second doped layer 118 may be doped with N-type ions. Thus, during the subsequently thermal annealing process, an interface reaction may occur at the interface between the first doped layer 107 and the second doped layer 118. Such an interface reaction may adversely affect the performance of the FinFET structure.

Further, because the portion of the first doped layer 107 and the portion of the second doped layer 118 on the surface of the substrate 101 may be removed by the mask-less etching process, the pore-filling ability of the dielectric layer subsequently formed on the surface of the substrate 101 may be improved. Thus, the voids in the dielectric layer may be reduced.

During the mask-less etching process, the hard mask layer 104 on the top surface of the first fin 102 may protect the first fin 102. Similarly, the hard mask layer 104 on the top surface of the second fin 103 may protect the second fin 103.

Figure 10:
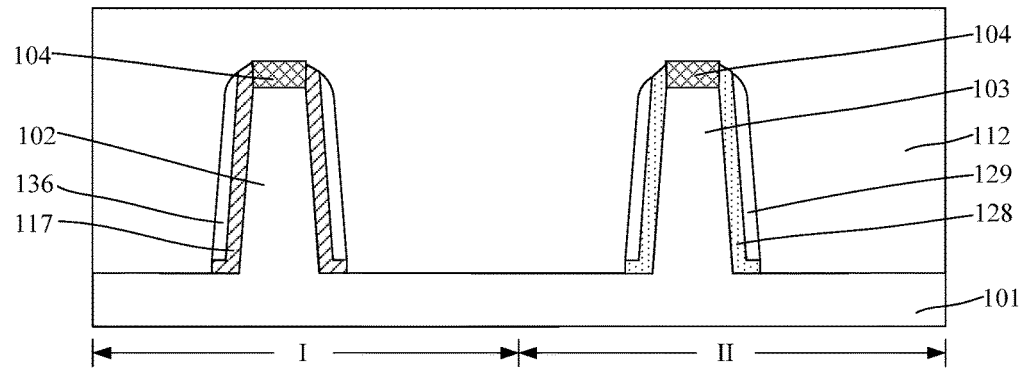

Returning to FIG. 15, after the mask-less etching process, a dielectric film may be formed (S110). FIG. 10 illustrates a corresponding semiconductor structure.

As shown in FIG. 10, a dielectric film 112 is formed on the surface of the substrate 101. The dielectric film 112 may also cover the side surfaces of the first doped sidewall spacers 117 and the side surfaces of the second doped sidewall spacers 128. The top of the dielectric film 112 may be higher than the top of the first fin 102 and the top of the second fin 103.

Further, in one embodiment, the first cap sidewall spacers 136 may be formed on the side surfaces of the first doped sidewall spacers 117; and the second cap sidewall spacers 129 may be formed on the side surfaces of the second sidewall spacers 128, the dielectric film 112 may also cover the side surfaces of the first cap sidewall spacers 136 and the side surfaces of the second cap sidewall spacers 129. That is, the dielectric film 112 may also fill the openings between the first fin 102 and the second fin 103.

The depth-to-width of the openings filled by the dielectric film 112 may be relatively large. The openings filled by the dielectric film 112 may include the openings formed by the adjacent first fins 102 and the substrate 101, the openings formed by the adjacent second fins 103 and the substrate 101; and the openings formed by the first fins 101, the second fins 102 and the substrate 101.

In one embodiment, to improve the gap-filling ability of the dielectric film 112 so as to cause the subsequently formed dielectric layer and the bottom portion of the side surfaces of the first fin 102 and the bottom portion of the side surfaces of the second fin 103 to have dense contacts; and to prevent the formation of voids in the dielectric layer, a flowable CVD (FCVD) process may be used to form the dielectric film 112.

During the FCVD process, the substrate 101 may be kept in a pre-determined temperature range so as to cause the precursors of the FCVD process to be able to fill into the openings; and a precursor material film may be formed in the openings. Specifically, a relatively low substrate temperature (lower than approximately 150° C.) may keep the liquidity and viscosity of the precursors in the openings. Because the precursors may have certain liquidity and viscosity, when such precursors are filled into the openings, a void-less filling may be achieved on the bottoms of the openings; and voids may not be formed on the bottom of the openings.

In one embodiment, during the FCVD process, the temperature of the substrate 101 may be lower than approximately 150° C. For example, the temperature of the substrate 101 may be approximately 20° C., 50° C., 70° C., or 110° C., etc.

The precursors of the FCVD process may include any appropriate chemicals, such as one or more of trisilylamine (TSA), silane, methyl silane, dimethylsilane, trimethylsilane, tetramethylsilane, and tetraethyl orthosilicate, etc. The FCVD process may be performed under an oxygen-containing environment. The oxygen-containing environment may be a gas environment including one or more of $O_3$, $O_2$, and $H_2O_2$, etc.

In one embodiment, the precursor of the FCVD process includes TSA; and the FCVD process is performed under an $O_3$ environment. Specifically, the flow rate of the precursor into the reaction chamber may be in a range of approximately 100 sccm-3000 sccm. The flow rate of $O_3$ into the reaction chamber may be in a range of approximately 20 sccm-1000 sccm. The pressure of the reaction chamber may be in a range 0.1 Torr-10 Torr. The temperature of the reaction chamber may be in a range of approximately 20° C.-150° C. Inert gas, such as Ar, He, or Xe, etc., may also be introduced into the reaction chamber. The flow rate of the inert gas may be in a range of approximately 1000 sccm-10000 sccm.

In one embodiment, after forming the dielectric film 112, an annealing solidification process may be performed to the dielectric film 112. The annealing solidification process may be performed in the an oxygen-containing environment. During the annealing solidification process, the chemical bonds in the dielectric film 112 may be rearranged; and the Si—O bonds and the O—Si—O bonds in the dielectric film 112 may be increased. Further, the compactness of the dielectric film 112 may be increased.

In one embodiment, to prevent the P-type ions in the first doped sidewall spacers 117 and the N-type ions in the second doped sidewall spacers 128 from diffusing too early, the temperature of the annealing solidification process may not be significantly high. Further, the temperature of the annealing solidification process may not be substantially low. If the temperature of the annealing solidification process is substantially low, the compactness of the annealed dielectric film 112 may be too low. Thus, the temperature of the annealing solidification process may be in a range of approximately 400° C.-600° C.

Figure 11:
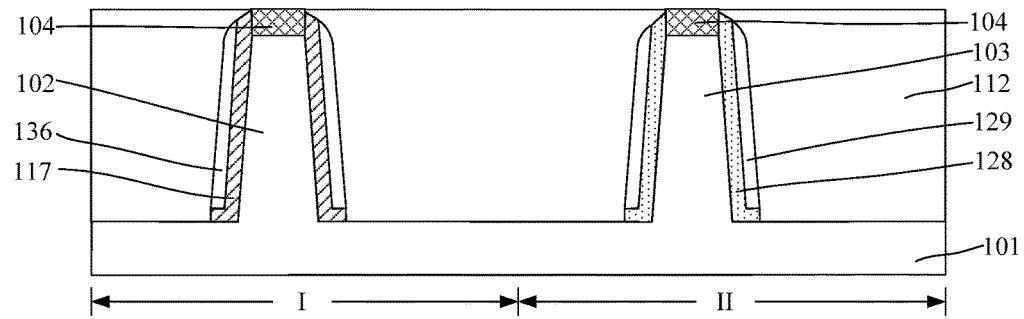

Returning to FIG. 15, after forming the dielectric film 112, the dielectric film 112 may be planarized (S111). FIG. 11 illustrates a corresponding semiconductor structure.

As shown in FIG. 11, the dielectric film 112 is planarized; and the hard mask layer 104 is exposed. That is, the top surface of the hard mask layer 104 may be used as a stop position of the planarization process.

The dielectric film 112 may be planarized by any appropriate process. In one embodiment, a chemical mechanical polishing (CMP) process is used to planarize the dielectric film 112. The CMP process may remove the portion of the dielectric film 112 higher than the top surface of the hard mask layer 104.

Figure 12:
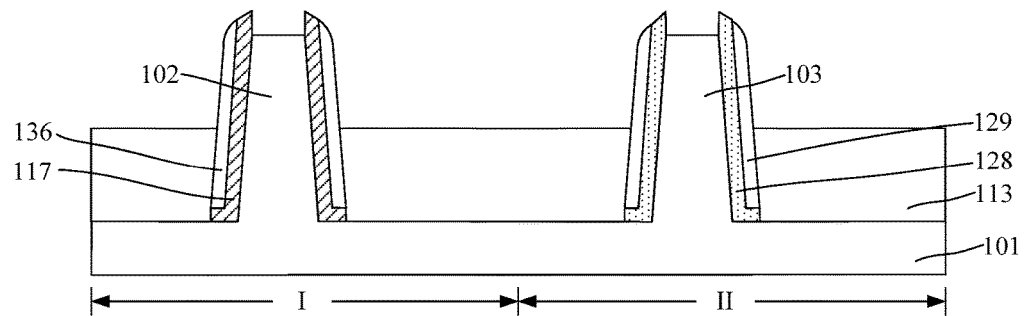

Returning to FIG. 15, after the planarization process, a dielectric layer may be formed (S112). FIG. 12 illustrates a corresponding semiconductor structure.

As shown in FIG. 12, a dielectric layer 113 is formed. Further, the hard mask layer 104 may be removed.

The dielectric layer 113 may cover the bottom portions of the first doped sidewall spacers 117 and the bottom portions of the second doped sidewall spacers 128. Further, the top surface of the dielectric layer 113 may be lower than the top surface of the first fin 102 and the top surface of the second fin 103.

In one embodiment, the first cap sidewall spacers 136 may be formed on the side surfaces of the first doped sidewall spacers 117; and the second cap sidewall spacers 129 may be formed on the side surfaces of the second doped sidewall spacers 128. The dielectric layer 113 may also cover the bottom portions of the first cap sidewall spacers 136 and the bottom portions of the second cap sidewall spacers 129.

The dielectric layer 113 may be used as an insulation structure of the FinFET structure. The dielectric film 112 may have less voids; and the process for forming the dielectric film 112 (FCVD process) may have a relatively high gap-filling ability. The insulation structure of the FinFET may have a relatively high electrical insulation ability.

The dielectric layer 113 may be formed by etching back the dielectric film 112 (referring to FIG. 11) with a partial thickness. The etch-back process may be a dry etching process, a wet etching process, or a combination of a dry etching process and a wet etching process.

After the etch-back process, the hard mask layer 104 may be removed. Various processes may be used to remove the hard mask layer 104, such as a dry etching process, or a wet etching process, etc.

Figure 13:
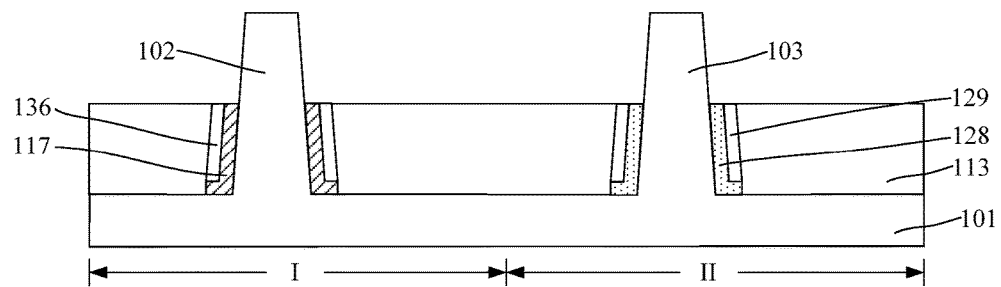

Returning to FIG. 15, after removing the hard mask layer 104, portions of the first doped sidewall spacers 117 and portions of second doped sidewall spacers 128 may be removed (S113). FIG. 13 illustrates a corresponding semiconductor structure.

As shown in FIG. 13, portions of the first doped sidewall spacers 117 higher than the dielectric layer 113 are removed; and portions of the second doped sidewall spacers 128 higher than the dielectric layer 113 are also removed. Further, before removing portions of the first doped sidewall spacers 117 higher than the dielectric layer 113 and portions of the second doped sidewall spacers 128 higher than the dielectric layer 113, portions of the first cap sidewall spacers 136 higher than the dielectric layer 113 may be removed; and portions of the second cap sidewall spacers 129 higher than the dielectric layer 113 may also be removed The portion of the first fin 102 higher than dielectric layer 113 may be configured as the channel region of the NMOS device. Removing the portions of the first doped sidewall spacers 117 higher than the dielectric layer 113 may avoid the subsequent doping to the channel region of the NMOS device; and the channel region of the NMOS device may have a relatively high carrier mobility.

The portion of the second fin 103 higher than dielectric layer 113 may be configured as the channel region of the PMOS device. Removing the portions of the second doped sidewall spacers 128 higher than the dielectric layer 113 may avoid the subsequent doping to the channel region of the PMOS device; and the channel region of the PMOS device may have a relatively high carrier mobility.

In one embodiment, the portions of the first cap sidewall spacers 136 higher than the dielectric layer 113 and the portions of the second cap sidewall spacers 129 higher than the dielectric layer 113 may be removed by a wet etching process. The etching solution of the wet etching process may be a phosphoric acid solution. The mass concentration of the phosphoric acid solution may be in a range of approximately 65%-85%. The temperature of the etching solution during the wet etching process may be in a range of approximately 120° C.-200° C.

In one embodiment, the portions of the first doped sidewall spacers 117 higher than the dielectric layer 113 and the portions of the second doped sidewall spacers 128 higher than the dielectric layer 113 may be removed by a wet etching process. The etching solution of the wet etching process may be a HF solution.

Returning to FIG. 15, after removing the portions of the first doped sidewall spacers 117 higher than the dielectric layer 113 and the portions of the second doped sidewall spacers 128 higher than the dielectric layer 113, a thermal annealing process may be performed (S114). FIG. 14 illustrates a corresponding semiconductor structure.

As shown in FIG. 14, a thermal annealing process is performed on the remaining first doped sidewall spacers 117 and the remaining second doped sidewall spacers 128. The thermal annealing process may cause the P-type ions in the first doped sidewall spacers 117 to diffuse into the first fin 102 to form a third well region in the first fin 102; and cause the N-type ions in the second doped sidewall spacers 128 to diffuse into the second fin 103 to form a fourth well region in the second fin 103.

The thermal annealing process may be a laser annealing process, a spike annealing process, a millisecond thermal annealing process, or a rapid thermal annealing process, etc. In one embodiment, the temperature of the thermal annealing process may be in a range of approximately 900° C.-1100° C.

Because the first cap sidewall spacers 136 may have a relatively large compactness; and the compactness of the first cap sidewall spacers 136 may be greater than the compactness of the first doped sidewall spacers 117, during the thermal annealing process, the first cap sidewall spacers 136 formed on the side surfaces of the first doped sidewall spacers 117 may prevent the P-type ions in the first doped sidewall spacers 117 from diffusing into the dielectric layer 113. Thus, the P-type ions in the first doped sidewall spacers 117 may diffuse into the first fin 102 as much as possible; and the third well region (not shown) may be formed in the first fin 102.

The doping concentration of the third well region may be greater than the doping concentration of the first well region in the substrate 101 in the first region I. Thus, a super step retrograde well (SSRW) may be formed in the NMOS device. The SSRW may be able to increase the breakdown voltage between the source region and the drain region formed in the first fin 102; and prevent the breaking down issue between the source region and the drain region. Further, the SSRW may prevent the doping ions in the substrate 101 from diffusing into the first fin 102; and prevent the threshold voltage drift. Thus, the mismatch of the NMOS device may be improved. Accordingly, the uniformity of the semiconductor device may be improved. For example, it may be able to improve the electrical parameter mismatch between the pull-up (PU) transistors and PU transistors of the SRAM device, the electrical parameter mismatch between the pull-down (PD) transistors and PD transistors of the SRAM device. The electrical parameters may be the threshold voltage (Vt) and the saturated current (Idast), etc.

Further, the method for forming the third well region in the first fin 102 may be a solid source doping (SSD) process. By diffusing the P-type ions in the doped sidewall spacers 117 into the first fin 102, the damage caused by an ion implantation process may be avoided. Thus, the first fin 102 may have a desired morphology and crystal lattice quality. Further, it may avoid the unnecessary doping to the top of the first fin 102 higher than the dielectric layer 113. Thus, the carrier mobility of the channel region of the NMOS device may be improved.

Similarly, the compactness of the second cap sidewall spacers 129 may be greater than the compactness of the second doped sidewall spacers 128, during the thermal annealing process, the second cap sidewall spacers 129 formed on the side surfaces of the second doped sidewall spacers 128 may prevent the N-type ions in the second doped sidewall spacers 128 from diffusing into the dielectric layer 113. Thus, the N-type ions in the second doped sidewall spacers 129 may diffuse into the second fin 103 as much as possible; and the fourth well region (not shown) may be formed in the second fin 103.

The doping concentration of the fourth well region may be greater than the doping concentration of the second well region in the substrate 101 in the second region II. Thus, a SSRW may be formed in the PMOS device. The SSRW may be able to increase the breakdown voltage between the source region and the drain region formed in the second fin 102; and prevent the breaking down issue between the source region and the drain region. Further, the SSRW may prevent the doping ions in the substrate 101 from diffusing into the second fin 103; and prevent the threshold voltage drift. Thus, the mismatch of the PMOS device may be improved. Accordingly, the uniformity of the semiconductor device may be improved. For example, it may be able to improve the electrical parameter mismatch between the pull-up (PU) transistors and PU transistors of the SRAM device, and the electrical parameter mismatch between the pull-down (PD) transistors and PD transistors of the SRAM device. The electrical parameters may be the threshold voltage (Vt) and the saturated current (Idast), etc.

Further, the method for forming the fourth well region in the second fin 103 may be a SSD process. By diffusing the N-type ions in the second doped sidewall spacers 128 into the second fin 103, the damage caused by an ion implantation process may be avoided. Thus, the second fin 103 may have a desired morphology and crystal lattice quality. Further, it may avoid the unnecessary doping to the top of the second fin 103 higher than the dielectric layer 113. Thus, the carrier mobility of the channel region of the PMOS device may be improved.

Further, during the thermal annealing process, the first doped sidewall spacers 117 and the second doped sidewall spacers 128 may have no interface. Thus, the interface reaction during the thermal annealing process may be avoided. Accordingly, the adverse effect caused by the interface reaction may be avoided; and the electrical performance of the FinFET structure may be improved.

After the thermal annealing process, a first gate structure (not shown) may be formed over the first fin 102. The first gate structure may cover portions the top surface and the side surfaces of the first fin 102. Further, a source region may be formed in the first fin 102 at one side of the first gate structure; and a drain region may be formed in the first fin 102 at the other side of the first gate structure. Further, a second gate structure (not shown) may be formed over the second fin 103. The second gate structure may cover portions the top surface and the side surfaces of the second fin 103. Further, a source region may be formed in the second fin 103 at one side of the second gate structure; and a drain region may be formed in the second fin 103 at the other side of the first gate structure.

Thus, a FinFET structure may be formed by the disclosed methods and processes; and FIG. 14 illustrates a corresponding semiconductor structure. As shown in FIG. 14, the FinFET structure may include a substrate 101 having a first region I and a second region II; and a first fin 102 formed on the substrate 101 in first region I, and a second fin 103 formed on the substrate 101 in the second region II. The FinFET structure may also include first doped sidewall spacers 117 with top surfaces lower than the top surface of the first fin 102 formed on portions of the side surfaces of the first fin 102; and second doped sidewall spacers 128 with top surfaces lower than the top surface of the second fin 103 formed on portions of the side surfaces of the second fin 103. Further, the FinFET structure may include first cap sidewall spacers 136 formed on the side surfaces of the first doped sidewall spacers 117; and second cap sidewall spacers 129 formed on the side surfaces of the second doped sidewall spacers 128. Further, the FinFET structure may also include a first well region (not shown) in the substrate 101 in the first region I; and a third well region (not shown) forming a super step retrograde well with the first well region formed in the first fin 102. Further, the Fin FET structure may also include a second well region (not shown) in the substrate 101 in the second region II; and a fourth well region (not shown) forming a super step retrograde well with the second well region formed in the second fin 103. The detailed structures and intermediate structures are described above with respect to the fabrication processes.

Therefore, according to the disclosed methods and processes, the method for forming the third well region in the first fin may be a solid source doping (SSD) process. Thus, the damage caused by an ion implantation process may be avoided. Thus, the first fin may have desired morphology and crystal lattice quality; and the carrier mobility of the channel region of the first fin may be improved. Further, the first well region and the third well region may form a SSRW structure. Thus, the breaking-down between the source region and the drain region in the first fin may be prevented; and the threshold voltage drift in the first fin may be avoided.

Further, the fourth well region may also be formed by a SSD process. Thus, the damage caused by an ion implantation process may be avoided. Thus, the second fin may have a desired morphology and crystal lattice quality; and the carrier mobility of the channel region of the second fin may be improved. Further, the second well region and the fourth well region may form a SSRW structure. Thus, the breaking-down between the source region and the drain region in the second fin may be prevented; and the threshold voltage drift in the second fin may be avoided.

Further, a mask-less etching process may be performed on the first doped layer and the second doped layer to form first doped sidewall spacers on the side surfaces of the first fin and second doped sidewall spacers on the side surfaces of the second fin. Thus, the first doped sidewall spacers and the second doped sidewall spacers may have no interface. Therefore, during the thermal annealing process, the interface reaction may not happen. Accordingly, the adverse effect caused by the interface reaction may be avoided; and the electrical performance of the FinFET structure may be further improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a fin field-effect transistor (FinFET) structure, comprising:
    providing a substrate having a first region and a second region;
    forming a first well region in the substrate in the first region and a second well region in the substrate in the second region;
    forming at least one first fin on the substrate in the first region and at least one second fin on the substrate in the second region;
    forming a first doped layer covering the at least one first fin over the substrate;
    forming a second doped layer covering the at least one second fin over the substrate;
    forming first doped sidewall spacers on side surfaces of the at least one first fin and second doped sidewall spacers on side surfaces of the at least one second fin by at least one mask-less etching process, wherein the first doped sidewall spacers and the second doped sidewall spacers are doped with different types of ions;
    forming first cap sidewall spacers with a compactness greater than a compactness of the first doped sidewall spacers on side surfaces of the first doped sidewall spacers;
    forming second cap sidewall spacers with a compactness greater than a compactness of the second doped sidewall spacers on side surfaces of the second doped sidewall spacers;
    forming a dielectric layer covering bottom portions of the side surfaces of the at least one first fin and bottom portions of the side surfaces of the at least one second fin; and
    after forming the dielectric layer, performing a thermal annealing process to the first doped sidewall spacers and the second doped sidewall spacers to form a third well region in the at least one first fin and a fourth well region in the at least one second fin, respectively.

2. The method according to claim 1, wherein the dielectric layer is formed after forming the first doped sidewall spacers and the second doped sidewall spacers,
    wherein a top surface of the dielectric layer is lower than a top surface of the at least one first fin and a top surface of the at least one second fin, and
    the top surface of the at least one first fin is higher than a top surface of the first doped sidewall spacers and the top surface of the at least one second fin is higher than a top surface of the second doped sidewall spacers.

3. The method according to claim 2, wherein:
    a type of the first region is different from a type of the second region;
    the first doped layer is doped with a first type of ions;
    the second doped layer is doped with a second type of ions;
    the first type is different from the second type;
    the first doped sidewall spacers are doped with the first type of ions;
    the second doped sidewall spacers are doped with the second type of ions.

4. The method according to claim 1, wherein forming the first doped layer and the second doped layer comprises:
    forming a first doped film on the surface of the substrate, top and side surfaces of the at least one first fin, and top and side surfaces of the at least one second fin;
    etching the first doped film in the second region to form the first doped layer;
    forming a second doped film on the first doped layer in the first region, the surface of the substrate in the second region, and side and top surfaces of the second fin; and
    removing a portion of the second doped film on the first doped layer,
    wherein:
    the first doped film is doped with the first type of ions; and
    the second doped film is doped with the second type of ions.

5. The method according to claim 1, wherein:
    the thermal annealing process is one of a spike annealing process and a laser annealing process.

6. The method according to claim 1, wherein:
    a temperature of the thermal annealing process is in a range of approximately 900° C.-1100° C.

7. The method according to claim 1, wherein:
    the first region is an NMOS region;
    the first type of doping ions are P-type ions;
    the second region is a PMOS region; and
    the second type doping ions are N-type ions.

8. The method according to claim 7, wherein:
    the first doped layer is made of silicon oxide doped with B ions; and
    the second doped layer is made of silicon oxide doped with P ions.

9. The method according to claim 7, wherein:
    a thickness of the first doped layer is in a range of approximately 1 nm-4 nm;
    a thickness of the second doped layer is in a range of approximately 1 nm-4 nm.

10. The method according to claim 1, wherein forming the at least one first fin and the at least one second fin on the substrate comprises:
    forming a hard mask layer on a surface of the substrate; and
    etching the substrate using the hard mask layer as an etching mask.

11. The method according to claim 1, wherein forming the dielectric layer comprises:
    forming a dielectric film covering side surfaces of the at least one first fin and the at least one second fin over the substrate by a flowable chemical vapor deposition process;
    planarizing the dielectric film; and
    etching-back the planarized dielectric film with a partial thickness.

12. The method according to claim 11, after forming the dielectric layer, further comprising:
    performing an annealing solidification process on the planarized dielectric film with a temperature in a range of approximately 400° C.-600° C.

13. The method according to claim 1, before forming the first doped film and the second doped film, further comprising:
    forming a liner oxide layer on surfaces of the at least one first fin and the at least one second fin by an oxidation process; and
    removing the liner oxide layer.

14. A fin field-effect transistor (FinFET) structure, comprising:
    a substrate having a first region and a second region;
    a first well region formed in the substrate in the first region and a second well region formed in the substrate in the second region;
    at least one first fin formed on the substrate in first region and at least one second fin formed on the substrate in the second region;
    first doped sidewall spacers with top surfaces lower than a top surface of the at least one first fin formed on bottom portions of side surfaces of the at least one first fin;
    second doped sidewall spacers with top surfaces lower than a top surface of the at least one second fin formed on bottom portions of side surfaces of the at least one second fin;
    first cap sidewall spacers formed on side surfaces of the first doped sidewall spacers, wherein the first cap sidewall spacers have a compactness greater than a compactness of the first doped sidewall spacers on side surfaces of the first doped sidewall spacers;
    second cap sidewall spacers formed on side surfaces of the second doped sidewall spacers, wherein the second cap sidewall spacers have a compactness greater than a compactness of the second doped sidewall spacers on side surfaces of the second doped sidewall spacers;
    a dielectric layer covering the side surfaces of the first doped sidewall spacers and the second doped sidewall spacers formed over the substrate; and
    a third well region in the at least one first fin and a fourth well region in the at least one second fin formed by ion diffusions from the first doped sidewall spacers and the second doped sidewall spacers, respectively.

15. The FinFET structure according to claim 14, wherein:
    a doping concentration of the third well region is greater than a doping concentration of the first well region; and
    a doping concentration of the fourth well region is greater than a doping concentration of the second well region.

16. The FinFET structure according to claim 14, wherein:
    the first region is an NMOS region;
    the first doped sidewall spacers are doped with P-type ions;
    the second region is a PMOS region; and
    the second doped sidewall spacers are doped with N-type ions.

17. The FinFET structure according to claim 14, wherein:
    the first doped sidewall spacers are made of silicon oxide doped with B ions; and
    the second doped sidewall spacers are made of silicon oxide doped with P ions.

18. The method according to claim 1, wherein:
    a doping concentration of the third well region is greater than a doping concentration of the first well region; and
    a doping concentration of the fourth well region is greater than a doping concentration of the second well region.

19. The method according to claim 1, wherein:
    the first cap sidewall spacers prevent ions in the first doped sidewall spacers from diffusing into the dielectric layer, and
    the second cap sidewall spacers prevent ions in the second doped sidewall spacers from diffusing into the dielectric layer.

20. The method according to claim 2, wherein:
    the dielectric layer is directly on the first cap sidewall spacers and the second cap sidewall spacers,
    the top surface of the dielectric layer is coplanar with on top surfaces of the first doped sidewall spacers and on top surfaces of the second doped sidewall spacers.

* * * * *